United States Patent [19]

Ishikura

[11] Patent Number: 4,883,773
[45] Date of Patent: Nov. 28, 1989

[54] METHOD OF PRODUCING MAGNETOSENSITIVE SEMICONDUCTOR DEVICES

[75] Inventor: Takuro Ishikura, Nara, Japan

[73] Assignee: Sharp Kabushiki Kaisha, Osaka, Japan

[21] Appl. No.: 320,911

[22] Filed: Mar. 7, 1989

Related U.S. Application Data

[63] Continuation of Ser. No. 126,556, Nov. 30, 1987, abandoned.

[30] Foreign Application Priority Data

Dec. 16, 1986 [JP] Japan ................. 61-300678

[51] Int. Cl.$^4$ ................... H01L 43/06; H01L 43/14
[52] U.S. Cl. ..................... 437/207; 437/086; 437/974; 148/DIG. 28; 148/Dig.135; 338/32 H
[58] Field of Search ............... 437/207, 211, 86, 974, 437/7, 133; 338/32 H; 148/Dig. 28

[56] References Cited

U.S. PATENT DOCUMENTS 4,021,767 5/1977 Nonaka et al. ................. 437/211

FOREIGN PATENT DOCUMENTS 0046583 4/1981 Japan .
0013385 1/1984 Japan .
0129483 7/1984 Japan .
0016478 1/1985 Japan .
0245220 12/1985 Japan .
0216372 9/1986 Japan .
926250 5/1963 United Kingdom .
1017033 1/1966 United Kingdom .

Primary Examiner—Brian E. Hearn
Assistant Examiner—Beverly A. Pawlikowski
Attorney, Agent, or Firm—Flehr, Hohbach, Test, Albritton & Herbert

[57] ABSTRACT

Magnetosensitive semiconductor devices are produced by forming a magnetosensitive part on one surface of a semiconductor substrate, pasting the semiconductor substrate thus formed on a jig, wrapping or etching the opposite surface of the semiconductor substrate, pasting a magnetic substrate on it with the jig pasted thereon, dividing the pasted substrates into individual unistructural elements each with a semiconductor chip and a magnetic piece, and die bonding, wire bonding and resin molding these individual elements.

6 Claims, 2 Drawing Sheets

FIG. — 2A 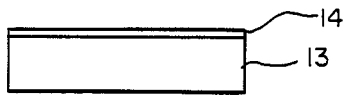
FIG. — 2B 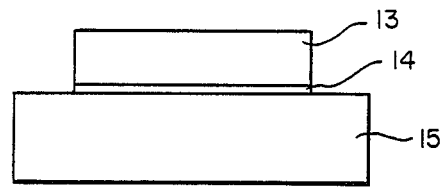
FIG. — 2C 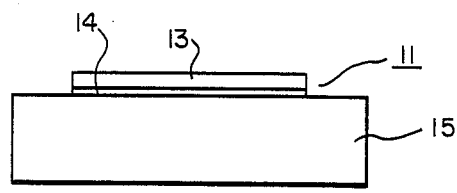
FIG. — 2D 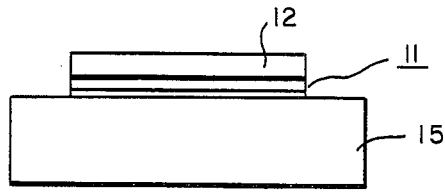
FIG. — 2E 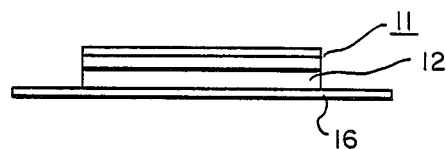
FIG. — 2F 

4,883,773

METHOD OF PRODUCING MAGNETOSENSITIVE SEMICONDUCTOR DEVICES

This is a continuation of application Ser. No. 126,556, filed Nov. 30, 1987, now abandoned.

BACKGROUND OF THE INVENTION

This invention relates to a method of producing magnetosensitive semiconductor devices and more particularly to such a method by which devices with improved sensitivity can be assembled easily and their substrates are not cracked easily.

FIGS. 3-5 show conventional assembly methods of a semiconductor chip and a magnetic piece which are prepared separately to produce a magnetosensitive semiconductor device such as a Hall element with improved sensitivity. According to the method shown in FIG. 3, a magnetic piece 2 is bonded onto a leadframe 1 and a semiconductor chip 3 such as a Hall element is bonded onto this magnetic piece 2. According to the method shown in FIG. 4, a semiconductor chip 3 is bonded onto a leadframe 1 and a magnetic piece 6 is bonded onto this semiconductor chip 3. According to the method shown in FIG. 5, a magnetic piece 2 is bonded onto a leadframe 1, a semiconductor chip 3 is bonded onto this magnetic piece 2 and then another magnetic piece 6 is bonded onto this semiconductor chip 3. In FIGS. 3-5, numerals 31 each indicate a magnetosensitive part of the semiconductor chip 3, numerals 4 indicate a terminal wire, and numerals 5 indicate a package resin. These methods, however, involve complicated assembly processes and do not effectively improve device sensitivity.

In order to improve the device sensitivity by using a magnetic piece, it is necessary to make it thick or to place it near the magnetosensitive part 31 of the semiconductor chip 3, but the thickness of the magnetic piece is limited by the size of the package. As for the placing of the magnetic piece near the magnetosensitive part of the semiconductor chip 3, there is a limit imposed by the thickness of the semiconductor chip 3 if the magnetic piece 2 is disposed below the semiconductor chip 3 as shown in FIGS. 3 and 5. Since the semiconductor chip 3 must be thick enough such that the semiconductor substrate will not easily crack when processed to form the magnetosensitive part 31 of a Hall element or the like. For this reason, its thickness must be greater than 200 μm. Even if the product is to be handled very carefully, a minimum of 150 μm is required.

SUMMARY OF THE INVENTION

It is an object of the present invention to provide a method by which magnetosensitive semiconductor devices of complicated structure can be produced without adversely affecting their sensitivity.

The above and other objects of the present invention are achieved by providing a method characterized as comprising the steps of forming a magnetosensitive part on one surface of a semiconductor substrate, pasting the semiconductor substrate thus formed on a handling wafer lapping or etching the opposite surface of the semiconductor substrate, pasting a magnetic substrate on it with the jig pasted thereon, dividing the pasted substrates into individual unistructural elements each with a semiconductor chip and a magnetic piece, and die bonding, wire bonding and resin molding these individual elements.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIGS. 2A-2F are sectional views of the element of FIG. 1 during its production.

DETAILED DESCRIPTION OF THE INVENTION

Figure 1:
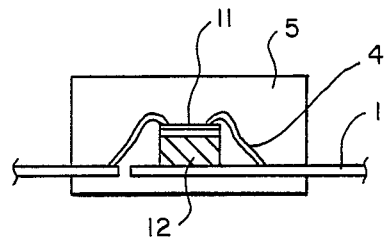
FIG. 1 is a sectional view of an ion injection type GaAs Hall element produced by a method embodying the present invention.
Figure 3:
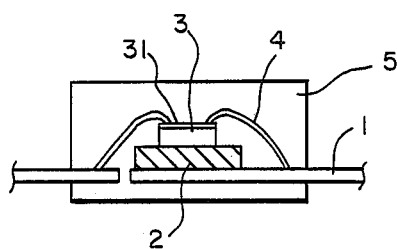
FIGS. 3-5 are sectional views of semiconductor elements produced by conventional methods.
Figure 4:
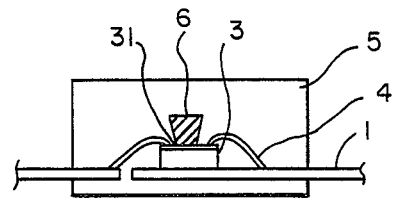
Figure 5:
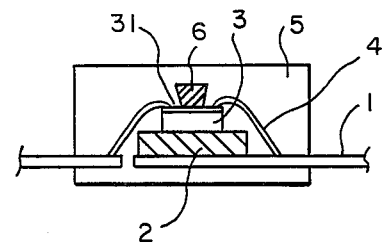

In what follows, reference is made to FIG. 1 and FIGS. 2A through 2F to explain a method of the present invention for producing an ion injection type GaAs Hall element. FIG. 1 is a sectional view of a completed product and FIGS. 2A through 2F show sectional views during its production.

Numeral 13 indicates a semi-insulative GaAs substrate and Si ions are injected thereinto at a desired area to form an n-type area by a heat treatment, thereby creating the active layer of a Hall element. Ion injection into a desired region can be easily achieved by using a photoresist to cover the areas other than the desired area and removing it after the injection. Thereafter, an ohmic electrode is formed on this active layer to form a magnetosensitive part 14 of a Hall element on one of the surfaces of the GaAs substrate 13 as shown in FIG. 2A.

Next, a handling wafer (also simply referred to as a jig) 15 is pasted onto the surface of the GaAs substrate 13 on which the magnetosensitive part 14 has been formed (FIG. 2B) and the opposite surface of the GaAs substrate 13 away from the magnetosensitive part 14 is lapped (FIG. 2C). This step may be replaced by that of etching, chemical or otherwise. Numeral 11 indicates the GaAs substrate 13 after it has been made thinner by the lapping step or the like. The device sensitivity improves as the thickness of the GaAs substrate 13 is reduced. In the present example, the thickness is about 100 μm after the lapping.

With the lapping jig 15 still pasted onto the GaAs substrate 11, an epoxy resin is used to paste a magnetic substrate (such as a Ni-Zn ferrite substrate) 12 on the GaAs substrate 11. The thicker the magnetic substrate, the more does the device sensitivity improve, but there is a limit to this thickness because the device must be sealed within a package. In this example, a ferrite substrate of thickness about 300 μm is used (FIG. 2D).

GaAs substrates with thickness less than 100 μm are easy to break and difficult to handle but since the lapping jig 15 is pasted onto the GaAs substrate 11 according to the present invention, the magnetic substrate 12 can be attached without difficulty. After the magnetic substrate 12 is pasted, the GaAs substrate 11 can also be handled easily even if the jig 15 is removed.

After the jig 15 is removed, the product is put upside-down such that the GaAs substrate 11 is above the magnetic substrate 12 and, after an adhesive tape 16 is attached onto the side of the magnetic substrate 12 (FIG. 2E), the substrates are divided by dicing into individual chips of 0.55 mm (FIG. 2F). Magnetosensitive semiconductor devices shown in FIG. 1 are obtained from these individual chips by the usual processes including die bonding, wire bonding and resin molding without any special process of attaching a magnetic piece. It was observed experimentally that a product thus obtained has sensitivity 1.47 times greater than one without the ferrite substrate.

The foregoing description of a preferred embodiment of the invention has been presented for purposes of illustration and description. It is not intended to be exhaustive or to limit the invention to the precise form disclosed. Such modifications and variations that may be apparent to a person skilled in the art are intended to be included within the scope of this invention.

What is claimed is:

1. A method of producing magnetosensitive semiconductor devices comprising the steps of forming a magnetosensitive part on a first surface of a semiconductor substrate, pasting a supporting member on said first surface of said semiconductor substrate, reducing the thickness of said semiconductor substrate to less than and about equal to 100 micrometers from a second surface thereof with said supporting member kept on said first surface, said first and second surfaces being opposite from each other and said magnetosensitive part not appearing on said second surface, pasting a magnetic substrate of thickness about 300 micrometers on said second surface of said semiconductor substrate to form a layered structure, thereafter removing said supporting member and attaching an adhesive tape on said magnetic substrate, thereafter dividing said layered structure into individual unistructural elements each having a semiconductor chip and a magnetic piece, and die bonding, wire bonding and resin molding said individual elements.

2. The method of claim 1 wherein said step of reducing the thickness comprises lapping said second surface of said semiconductor substrate.

3. The method of claim 1 wherein said step of reducing the thickness comprises etching said second surface of said semiconductor substrate.

4. The method of claim 1 wherein said semiconductor substrate comprises GaAs.

5. The method of claim 1 wherein said magnetic substrate comprises Ni-Zn ferrite.

6. The method of claim 1 wherein said magnetosensitive part is formed by ion injection.

* * * * *